United States Patent
Chou et al.

(10) Patent No.: US 12,148,783 B2
(45) Date of Patent: Nov. 19, 2024

(54) REDUCED CROSS-TALK IN COLOR AND INFRARED IMAGE SENSOR

(71) Applicant: Taiwan Semiconductor Manufacturing Co., Ltd., Hsin-Chu (TW)

(72) Inventors: Keng-Yu Chou, Kaohsiung (TW); Cheng Yu Huang, Hsinchu (TW); Chun-Hao Chuang, Hsinchu (TW); Wen-Hau Wu, New Taipei (TW); Wei-Chieh Chiang, Yuanlin Township (TW); Wen-Chien Yu, Hsin-Chu (TW); Chih-Kung Chang, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 525 days.

(21) Appl. No.: 17/216,955

(22) Filed: Mar. 30, 2021

(65) Prior Publication Data
US 2022/0320173 A1    Oct. 6, 2022

(51) Int. Cl.
*H01L 27/146* (2006.01)
*G02B 5/20* (2006.01)

(52) U.S. Cl.
CPC .... *H01L 27/14636* (2013.01); *H01L 27/1462* (2013.01); *H01L 27/14621* (2013.01); *H01L 27/14627* (2013.01); *H01L 27/14629* (2013.01); *H01L 27/1463* (2013.01); *H01L 27/1464* (2013.01); *H01L 27/14645* (2013.01);
(Continued)

(58) Field of Classification Search
CPC .......... H01L 27/14636; H01L 27/1462; H01L 27/14621; H01L 27/14627; H01L 27/14629; H01L 27/1463; H01L 27/1464; H01L 27/14645; H01L 27/14649;
(Continued)

(56) References Cited

U.S. PATENT DOCUMENTS

| 2012/0049306 A1* | 3/2012 | Ohba | H01L 27/14685 257/E31.127 |
| 2013/0181113 A1* | 7/2013 | Egawa | H01L 27/14623 257/E31.127 |

(Continued)

*Primary Examiner* — Karen Kusumakar
(74) *Attorney, Agent, or Firm* — Eschweiler & Potashnik, LLC

(57) ABSTRACT

Various embodiments of the present disclosure are directed towards an image sensor device including a first image sensor element and a second image sensor element disposed within a substrate. An interconnect structure is disposed along a front-side surface of the substrate and comprises a plurality of conductive wires, a plurality of conductive vias, and a first absorption structure. The first image sensor element is configured to generate electrical signals from electromagnetic radiation within a first range of wavelengths. The second image sensor element is configured to generate electrical signals from the electromagnetic radiation within a second range of wavelengths that is different than the first range of wavelengths. The second image sensor element is laterally adjacent to the first image sensor element. Further, the first image sensor element overlies the first absorption structure and is spaced laterally between opposing sidewalls of the first absorption structure.

20 Claims, 12 Drawing Sheets

(52) U.S. Cl.
CPC .. *H01L 27/14649* (2013.01); *H01L 27/14685* (2013.01); *H01L 27/14689* (2013.01); *G02B 5/208* (2013.01)

(58) Field of Classification Search
CPC ......... H01L 27/14685; H01L 27/14689; H01L 27/14625; G02B 5/208
See application file for complete search history.

(56) References Cited

U.S. PATENT DOCUMENTS

| | | | |
|---|---|---|---|
| 2014/0132812 A1 | 5/2014 | Soda | |
| 2018/0358393 A1* | 12/2018 | Sato | H01L 27/14687 |
| 2019/0096951 A1* | 3/2019 | Cheng | H01L 27/14632 |
| 2020/0203401 A1 | 6/2020 | Frey et al. | |
| 2021/0280617 A1* | 9/2021 | Sugizaki | H01L 27/14636 |
| 2022/0190016 A1* | 6/2022 | Dupoiron | H04N 25/17 |
| 2022/0199670 A1* | 6/2022 | Jang | H01L 27/14636 |
| 2022/0271094 A1* | 8/2022 | Dupoiron | H01L 27/14609 |
| 2023/0124400 A1* | 4/2023 | Asatsuma | H01L 27/14621 257/432 |
| 2023/0187460 A1* | 6/2023 | Gang | H01L 27/14636 257/432 |

* cited by examiner

1300 ──▲

┌─────────────────────────────────────────────────────────────────────┐
│ Form a plurality of pixel sensors within a substrate, where each pixel sensor │
│ comprises a first image sensor element laterally adjacent to a second image │
│ sensor element, where the first image sensor element is configured to │
│ generate electrical signals from electromagnetic radiation within a first │ ── 1302
│ range of wavelengths, and the second image sensor element is configured to │
│ generate electrical signals from electromagnetic radiation within a second │
│ range of wavelengths that is different from the first range of wavelengths │
└─────────────────────────────────────────────────────────────────────┘
                                    ▼
┌─────────────────────────────────────────────────────────────────────┐
│ Form an interconnect structure over a front-side surface of the substrate, │
│ where the interconnect structure comprises a plurality of conductive wires, │
│ a plurality of conductive vias, and a plurality of absorption structures, │
│ where each absorption structure comprises a conductive material (e.g., │ ── 1304
│ titanium nitride, tantalum nitride, tungsten, etc.) and overlies a │
│ corresponding first image sensor element │
└─────────────────────────────────────────────────────────────────────┘
                                    ▼
┌─────────────────────────────────────────────────────────────────────┐
│ From an isolation structure into a back-side surface of the substrate │ ── 1306
└─────────────────────────────────────────────────────────────────────┘
                                    ▼
┌─────────────────────────────────────────────────────────────────────┐
│ Form a grid structure and an upper dielectric structure over the back-side │ ── 1308
│ surface of the substrate │
└─────────────────────────────────────────────────────────────────────┘
                                    ▼
┌─────────────────────────────────────────────────────────────────────┐
│ Form a light filter array over the upper dielectric structure and form a │ ── 1310
│ plurality of micro-lenses over the light filter array │
└─────────────────────────────────────────────────────────────────────┘

Fig. 13

REDUCED CROSS-TALK IN COLOR AND INFRARED IMAGE SENSOR

BACKGROUND

Integrated circuits (IC) with image sensors are used in a wide range of modern day electronic devices. In recent years, complementary metal-oxide semiconductor (CMOS) image sensors (CISs) have begun to see widespread use, largely replacing charge-coupled devices (CCD) image sensors. Compared to CCD image sensors, CISs are increasingly favored due to low power consumption, a small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13 illustrates a methodology in flowchart format that illustrates some embodiments of forming an image sensor device including a first image sensor element, a second image sensor element, and an absorption structure that is configured to decrease cross-talk between the first and second image sensor elements.

DETAILED DESCRIPTION

Figure 1A:
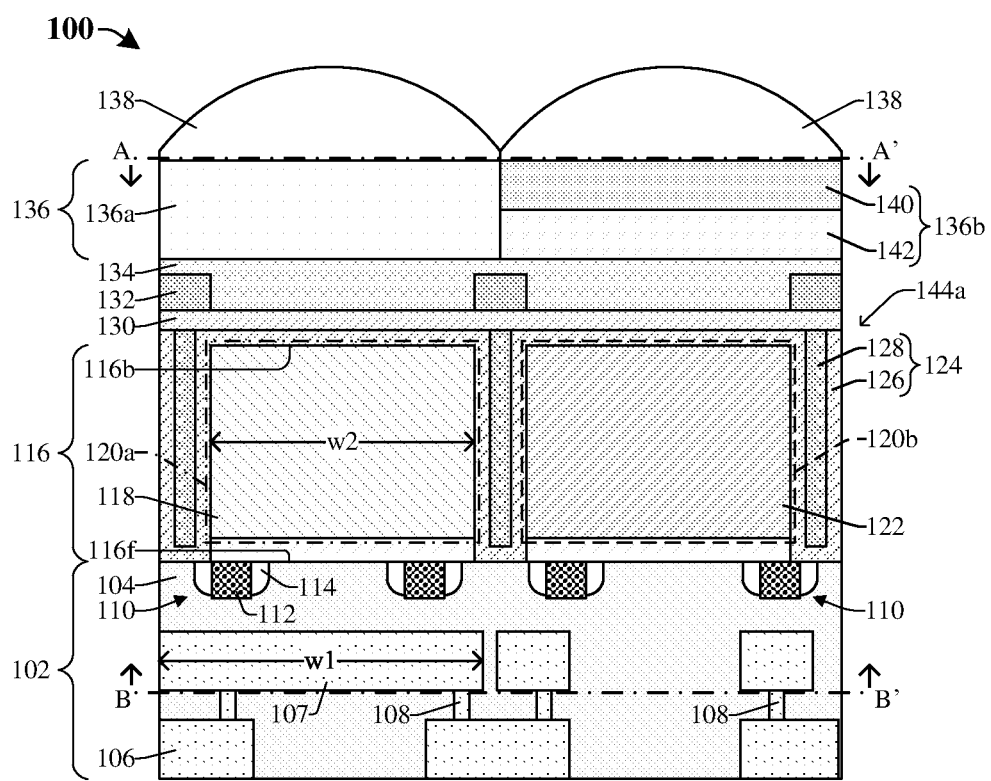
FIGS. 1A-1C illustrate various views of some embodiments of an image sensor device including a plurality of pixel sensors each comprising a first image sensor element, a second image sensor element, and an absorption structure that is configured to decrease cross-talk between the first and second image sensor elements.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element, but rather are merely generic identifiers. For example, "a first dielectric layer" described in connection with a first figure may not necessarily correspond to a "first dielectric layer" described in connection with some embodiments, but rather may correspond to a "second dielectric layer" in other embodiments.

Some complementary metal-oxide semiconductor sensors (CISs) include a plurality of image sensor elements (e.g., photodiodes) disposed in a semiconductor substrate. Pixel devices (e.g., transistors) are disposed along a front-side surface of the semiconductor substrate and are configured to process electrical signals generated by the plurality of image sensor elements. An interconnect structure comprising a plurality of conductive wires and a plurality of conductive vias is disposed along the front-side surface of the semiconductor substrate. Further, a light filter array having a plurality of light filters (e.g., a plurality of color filters, a plurality of infrared (IR) filters, any combination of the foregoing, or the like) is disposed along a back-side surface of the semiconductor substrate.

One challenge with the above CISs is cross-talk between laterally adjacent image sensor elements that are configured for different wavelengths. For example, the plurality of image sensor elements may comprise a first image sensor element and a second image sensor element laterally adjacent to the first image sensor element. The first image sensor element (e.g., a first photodiode) is configured to generate electrical signals from electromagnetic radiation within a first range of wavelengths (e.g., the first range of wavelengths comprises infrared (IR) radiation), and the second image sensor element (e.g., a second photodiode) is configured to generate electrical signals from electromagnetic radiation within a second range of wavelengths (e.g., the second range of wavelengths comprises visible light) that is different from the first range of wavelengths. During operation of the CIS, electromagnetic radiation from the first range of wavelengths may reflect off of conductive features in the interconnect structure (e.g., the conductive wires and/or the conductive wires) to the second image sensor element. This may decrease a signal-to-noise ratio (SNR) of the image sensor elements configured to generate electrical signals from the second range of wavelengths (e.g., the second image sensor element), thereby degrading a performance of the CIS.

In yet another example, a 2×2 image sensor may be arranged in a Bayer pattern which consists of a red pixel sensor, a blue pixel sensor, a first green pixel sensor, and a second green pixel sensor. Each of the color pixel sensors in the Bayer pattern comprise at least one IR image sensor element directly laterally adjacent to a respective color image sensor element. For example, the red pixel sensor includes a first image sensor element configured to generate electrical signals from electromagnetic radiation within the first range of wavelengths (e.g., IR radiation) directly laterally adjacent to a second image sensor element configured to generate electrical signals from electromagnetic radiation within the second range of wavelengths (e.g., red visible light). IR image sensors within the 2×2 image sensor may be laterally offset from one another by a respective color image sensor element. Due to this layout of the plurality of image sensor elements, electromagnetic radiation from the first range of wavelengths may travel to laterally adjacent color image sensor element(s), thereby further increasing cross-talk in the plurality of image sensor elements. This may further decrease SNR of the image sensor elements configured to generate electrical signals from the second range of wavelengths (e.g., the second image sensor element), thereby further degrading a performance of the CIS.

In some embodiments, the present application is directed towards an image sensor device having an interconnect structure and an image sensor element layout of a plurality of image sensor elements configured to decrease cross-talk between the plurality of image sensor elements. For example, the image senor device includes a plurality of image sensor elements disposed within a semiconductor substrate. A plurality of pixel devices (e.g., transistors) are disposed along a front-side surface of the semiconductor substrate and an interconnect structure is disposed along the front-side surface of the semiconductor substrate. The interconnect structure comprises a plurality of conductive wires and a plurality of conductive vias configured to provide electrical connections between devices disposed on and/or over the semiconductor substrate (e.g., the pixel devices). Further, the plurality of image sensor elements comprises a first image sensor element configured to generate electrical signals from electromagnetic radiation within a first range of wavelengths (e.g., IR radiation) and a second image sensor element configured to generate electrical signals from electromagnetic radiation within a second range of wavelengths (e.g., visible light radiation). The interconnect structure comprises an absorption structure directly underlying the first image sensor element. By virtue of a size and a conductive material (e.g., titanium nitride, tantalum nitride, tungsten, etc.) of the absorption structure, the absorption structure is configured to prevent reflection of electromagnetic radiation within the first range of wavelengths (e.g., IR radiation) to adjacent image sensor elements (e.g., the second image sensor element). This decreases cross-talk between neighboring image sensor elements and increases SNR of the second image senor element, thereby increasing a performance of the image sensor device.

Additionally, the image sensor elements may be arranged in one or more Bayer pattern(s) (e.g., a 2×2 layout) which consists of a red pixel sensor, a blue pixel sensor, a first green pixel sensor, and a second green pixel sensor. Each of the color pixel sensors in the Bayer pattern comprises at least one IR image sensor element directly laterally adjacent to a respective color image sensor element. Further, the IR image sensor elements in the 2×2 layout are arranged laterally adjacent to one another, thereby decreasing cross-talk between color image sensor elements and IR image sensor elements. Thus, the layout of the plurality of image sensor elements is configured to further decrease cross-talk between neighboring image sensor elements and increase SNR of the color image sensor elements, thereby further increasing the performance of the image sensor device.

Figure 1B:
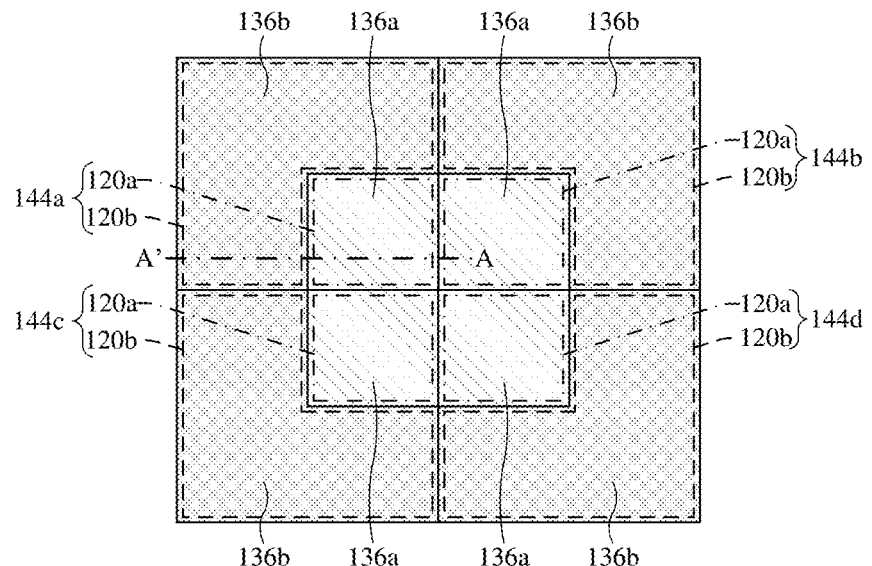
Figure 1C:
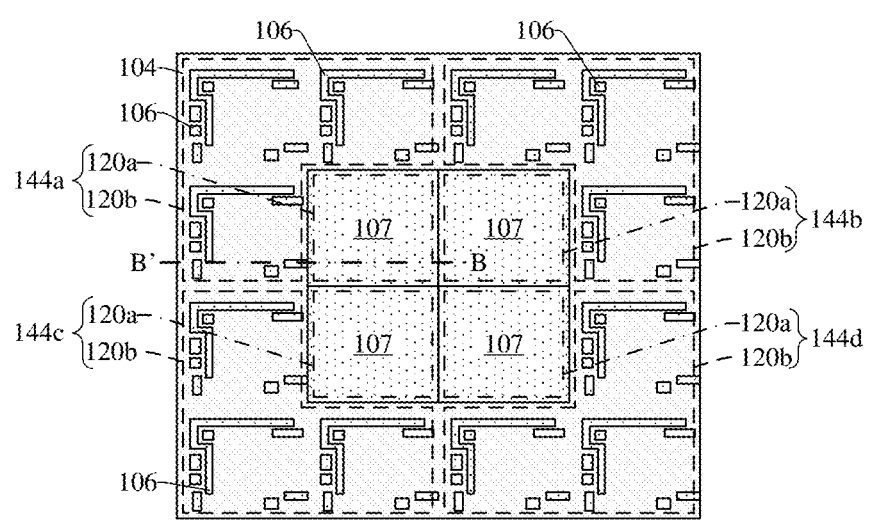

FIGS. 1A-1C illustrate various views of some embodiments of an image sensor device 100 including a plurality of pixel sensors 144a-d that comprises a plurality of image sensor elements 120a-b disposed within a substrate 116. FIG. 1A illustrates a cross-sectional view of some embodiments of the image sensor device 100 taken along the line A-A' of FIG. 1B. Further, FIG. 1B illustrates a top view of some embodiments of the image sensor device 100 taken along the line A-A' of the FIG. 1A. Furthermore, FIG. 1C illustrates a tip view of some embodiments of the image sensor device 100 taken along the line B-B'.

As illustrated in the cross-sectional view of FIG. 1A, the image sensor device 100 includes an interconnect structure 102 disposed along a front-side surface 116f of the substrate 116. A plurality of pixel devices 110 are disposed along the front-side surface 116f of the substrate 116. Further, the plurality of image sensor elements 120a-b includes a first image sensor element 120a and a second image sensor element 120b. The first and second image sensor elements 120a-b are configured to convert electromagnetic radiation (e.g., photons) into electrical signals (i.e., to generate electron-hole pairs from electromagnetic radiation). In some embodiments, the electromagnetic radiation is back-side illuminated (BSI) upon the image sensor device 100 (e.g., the electromagnetic radiation is disposed upon a back-side surface 116b of the substrate 116). The first image sensor element 120a is configured to generate electrical signals from electromagnetic radiation within a first range of wavelengths, while the second image sensor element 120b is configured to generate electrical signals from electromagnetic radiation within a second range of wavelengths that is different than the first range of wavelengths. In some embodiments, the first range of wavelengths may, for example, be or comprise infrared (IR) radiation (e.g., electromagnetic radiation with wavelengths in a range of between approximately 700 nanometers (nm) to approximately 2.5 millimeter (mm)), near IR (NIR) radiation (e.g., electromagnetic radiation with wavelengths in a range of between approximately 700 nm to approximately 1.1 mm), or the like. In further embodiments, the second range of wavelengths may, for example, be or comprise visible light (e.g., electromagnetic radiation with wavelengths in a range of between approximately 400 nm and approximately 700 nm).

The first and second image sensor elements 120a-b are disposed within the substrate 116. In some embodiments, the substrate 116 may, for example, be or comprise a semiconductor material such as silicon, crystalline silicon, monocrystalline silicon, bulk silicon, epitaxial silicon, another semiconductor material, the like, or any combination of the foregoing and/or has a first doping type (e.g., p-type doping). The first and second image sensor elements 120a-b may respectively comprise intrinsic and/or doped regions of the semiconductor material. The first image sensor element 120a includes a first photodetector region 118. In some embodiments, the first photodetector region 118 may, for example, comprise photodetector regions and/or layers such as charge storage region(s), floating node(s), surface pinning region(s), contact region(s), guard ring(s), etc. (not shown) configured to convert electromagnetic radiation (e.g., photons) from the first range of wavelengths into electrical signals and/or facilitate readout of the electrical signals. In yet further embodiments, the first photodetector region 118 may be or comprise a second semiconductor material (e.g., germanium) different from the semiconductor material (e.g., silicon) that is configured to increase quantum efficiency (QE) for electromagnetic radiation within the first range of wavelengths. In addition, the second image sensor element 120b includes a second photodetector region 122 that may, for example, be or comprise the semiconductor material (e.g., silicon) comprising a second doping type (e.g., n-type doping) opposite the first doping type. In yet further embodiments, the first doping type may be p-type and the second doping type may be n-type, or vice versa. In some embodiments, the first image sensor element 120a may be referred to as a first photodetector or a first photodiode and the second image sensor element 120b may be referred to as a second photodetector or a second photodiode.

In addition, the plurality of pixel devices 110 may comprise a gate structure 112 and a sidewall spacer structure 114 laterally enclosing the gate structure 112. The plurality of pixel devices 110 may be configured to facilitate readout of electrical signals generated by the plurality of image sensor elements 120a-b. In some embodiments, the pixel devices 110 may, for example, be or comprise transfer transistor(s), source-follower transistor(s), row select transistor(s), reset transistor(s), another suitable pixel device(s), or any combination of the foregoing. Further, the interconnect structure 102 comprises an interconnect dielectric structure 104, a plurality of conductive wires 106, a plurality of conductive vias 108, and a plurality of absorption structures 107. The interconnect structure 102 is configured to electrically couple semiconductor devices (e.g., the pixel devices 110) to one another or other semiconductor devices. An isolation structure 124 extends from a back-side surface 116b of the substrate 116 to the front-side surface 116f of the substrate 116. The isolation structure 124 may include a passivation layer 126 and trench layer 128, where the passivation layer 126 is disposed between the substrate 116 and the trench layer 128. In some embodiments, the isolation structure 124 may, for example, be configured as a back-side trench isolation (BTI) structure, a back-side deep trench isolation (BDTI) structure, another suitable isolation structure, or the like.

An upper passivation layer 130 is disposed along the back-side surface 116b of the substrate 116. Further, a grid structure 132 is disposed over the upper passivation layer 130 and may comprise a dielectric grid structure and/or a metal grid structure. An upper dielectric structure 134 is disposed over the upper passivation layer 130 and the grid structure 132. The plurality of image sensor elements 120a-b are spaced laterally between sidewalls of the grid structure 132. A light filter array 136 overlies the grid structure 132 and comprises a plurality of light filters 136a-b. In some embodiments, the plurality of light filters 136a-b include a first light filter 136a and a second light filter 136b. The first light filter 136a overlies the first image sensor element 120a and, in some embodiments, is configured to pass wavelengths within the first range of wavelengths while blocking other wavelengths that are different from the first range of wavelengths. Furthermore, the second light filter 136b overlies the second image sensor element 120b and, in some embodiments, is configured to pass wavelengths within the second range of wavelengths while blocking other wavelengths that are different from the second range of wavelengths. In further embodiments, the second light filter 136b comprises a color filter 142 overlying a band pass filter 140. Additionally, a plurality of micro-lenses 138 overlie the light filter array 136 and are configured to direct electromagnetic radiation towards the underlying image sensor elements 120a-b.

The absorption structure 107 underlies the first image sensor element 120a. In some embodiments, the absorption structure 107 may be part of the plurality of conductive wires 106 and may be referred to as a first conductive wire. In such embodiments, the absorption structure 107 may be configured as a conductive wire 106 and electrically couple semiconductor devices together. In some embodiments, a first width w1 of the absorption structure 107 is greater than a second width w2 of the first image sensor element 120a. In further embodiments, when viewed from above, an area of the absorption structure 107 is greater than an area of the first image sensor element 120a. Further, the absorption structure 107 comprises a conductive material (e.g., titanium nitride, tantalum nitride, tungsten, etc.) that is configured to interact with electromagnetic radiation within the first range of wavelengths (e.g., absorb the electromagnetic radiation within the first range of wavelengths). Accordingly, during operation of the image sensor device 100, electromagnetic radiation may pass from the back-side surface 116b of the substrate 116, through the first image sensor element 120a, to the interconnect structure 102. By virtue of the absorption structure 107 comprising the conductive material and having the relatively large area (e.g., greater than the area of the first image sensor element 120a), electromagnetic radiation within the first range of wavelengths may interact with the absorption structure 107 (e.g., be absorbed by the absorption structure 107) and may be impeded from reflecting towards the second image sensor element 120b. This, in part, decreases cross-talk between the first image sensor element 120a and the second image sensor element 120b, and increases a signal-to-noise ratio (SNR) of the second image sensor element 120b. Thus, a reliability of the image sensor device 100 is increased and an accuracy of images produced from the image sensor device 100 is increased.

Further, as illustrated in the top view of FIG. 1B, the image sensor device 100 includes the plurality of pixel sensors 144a-d. In some embodiments, the image sensor device 100 is configured as a 2×2 image sensor that is arranged in a Bayer pattern comprising a first pixel sensor 144a, a second pixel sensor 144b, a third pixel sensor 144c, and a fourth pixel sensor 144d. The plurality of pixel sensors 144a-d respectively comprise the first image sensor element 120a configured to generate electrical signals from the first range of wavelengths (e.g., IR radiation) and the second image sensor element 120b configured to generate electrical signals from the second range of wavelengths (e.g., visible light). In further embodiments, the first pixel sensor 144a is configured as a first green pixel sensor, the second pixel sensor 144b is configured as a blue pixel sensor, the third pixel sensor 144c is configured as a red pixel sensor, and the fourth pixel sensor 144d is configured as a second green pixel sensor. Further, in some embodiments, a layout of the plurality of pixel sensors 144a-d is configured such that the first image sensor element 120a of each pixel sensor 144a-d is directly laterally adjacent to one another. This, in part, reduces electromagnetic radiation from the first range of wavelengths traveling to the second image sensor element 120b of each pixel sensor 144a-d, thereby reducing cross-talk and further increasing the SNR of the second image sensor elements 120b. Thus, a reliability of the image sensor device 100 is further increased. Further, the second light filter 136b of each pixel sensor 114a-d extends from a first sidewall of a corresponding first light filter 136a to a second sidewall of the corresponding first light filter 136a, in which the first sidewall is perpendicular to the second sidewall.

In addition, as illustrated in the top view of FIG. 1C, the first image sensor element 120a of each pixel sensor 144a-d is laterally aligned with a corresponding absorption structure 107. In some embodiments, the absorption structure 107 is a single conductive structure that laterally extends across each pixel sensor 144a-d. By virtue of the area of the absorption structure 107 being greater than an area of a corresponding first image sensor element 120a, electromagnetic radiation within the first range of wavelengths may be impeded from traveling to the second image sensor element 120b of the plurality of pixel sensors 144a-d.

Figure 2A:
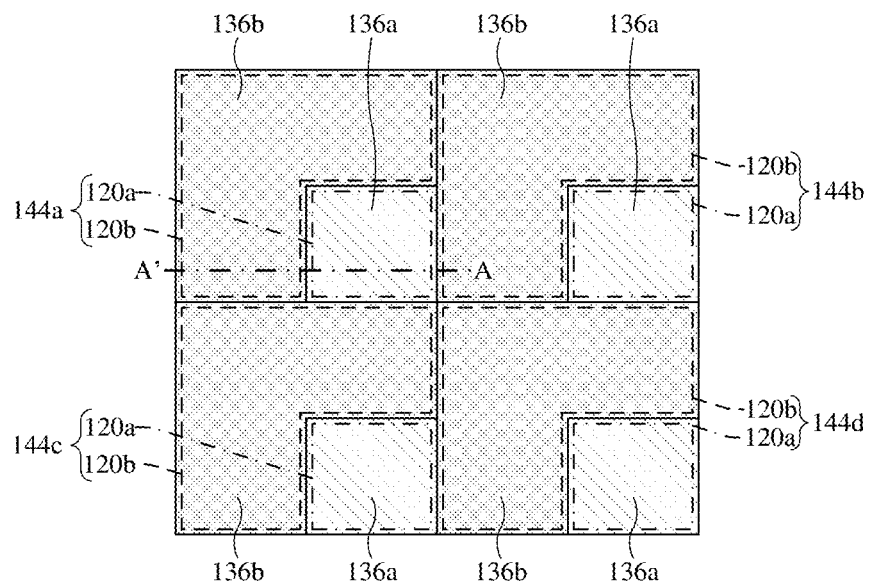
FIGS. 2A-2B through 4A-4B illustrate top views of some alternative embodiments of the image sensor device of FIGS. 1A-1C.
Figure 2B:
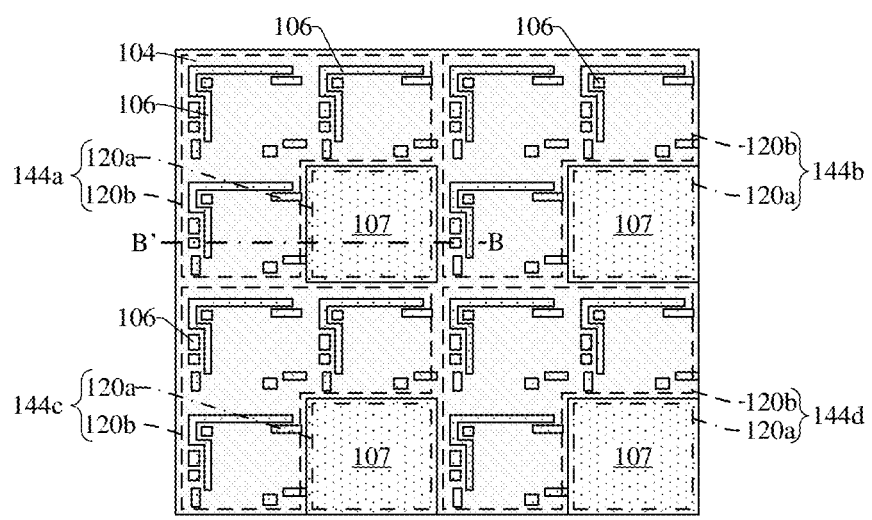

FIGS. 2A-2B illustrate top views of some alternative embodiments of the image sensor device 100 of FIGS. 1A-1C. FIG. 2A illustrates a top view of some embodiments of the image sensor device 100 taken from the line A-A' of the cross-sectional view of FIG. 1A. FIG. 2B illustrates another top view of various embodiments of the image sensor device 100 taken from the line B-B' of the cross-sectional view of FIG. 1A.

In some embodiments, each pixel sensor 144a-d comprises the first image sensor element 120a and the second image sensor element 120b. In an embodiment, the second light filter 136b continuously extends from a first sidewall of the first light filter 136a to a second sidewall of the first light filter 136a, where the first sidewall is perpendicular to the second sidewall. In some embodiments, the first light filter 136a of the first pixel sensor 144a is laterally separated from the first light filter 136a of the second pixel sensor 144b by the second light filter 136b of the second pixel sensor 144b. In further embodiments, the absorption structure 107 of the first pixel sensor 144a is laterally separated from the absorption structure 107 of the second pixel sensor 144b by the second image sensor element 120b of the second pixel sensor 144b.

Figure 3A:
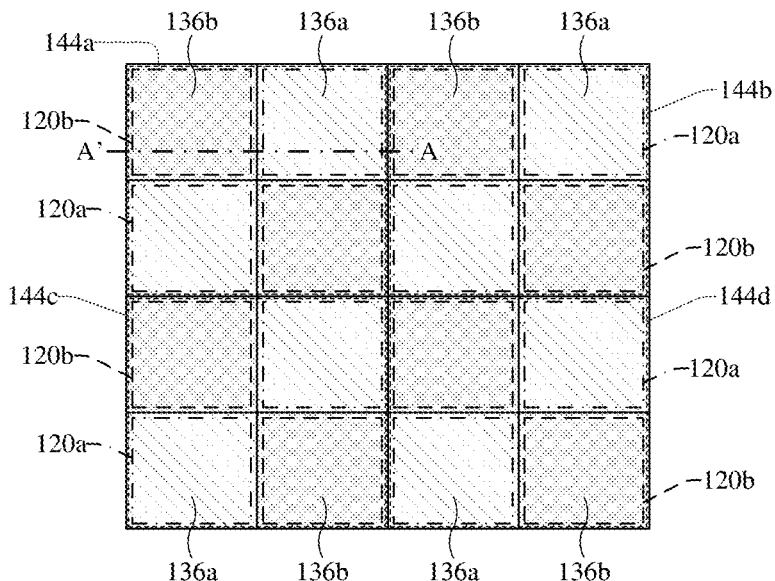
Figure 3B:
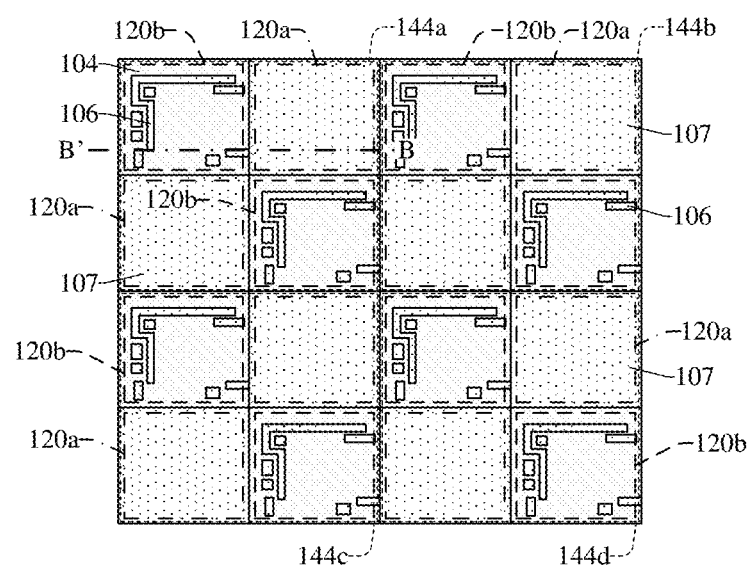

FIGS. 3A-3B illustrate top views of some alternative embodiments of the image sensor device 100 of FIGS. 1A-1C. FIG. 3A illustrates a top view of some embodiments of the image sensor device 100 taken from the line A-A' of the cross-sectional view of FIG. 1A. FIG. 3B illustrates another top view of various embodiments of the image sensor device 100 taken from the line B-B' of the cross-sectional view of FIG. 1A.

In some embodiments, each pixel sensor 144a-d comprises a plurality of first image sensor elements 120a and a plurality of second image sensor elements 120b, where the first image sensor elements 120a are spaced diagonal from each other. Further, the first light filter 136a overlies each first image sensor element 120a and the second light filter 136b overlies each second image sensor element 120b. In further embodiments, the first light filters 136a of the first pixel sensor 144a are respectively laterally separated from the first light filters 136a of the second pixel sensor 144b by the second light filters 136b of the second pixel sensor 144b. In addition, in various embodiments, each first image sensor element 120a is spaced laterally between opposing sidewalls of a corresponding absorption structure 107.

Figure 4A:
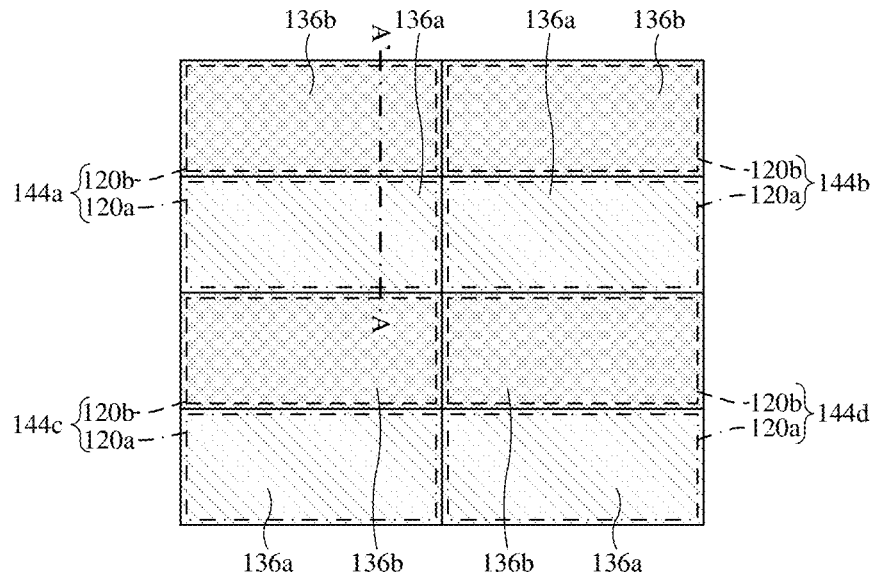
Figure 4B:
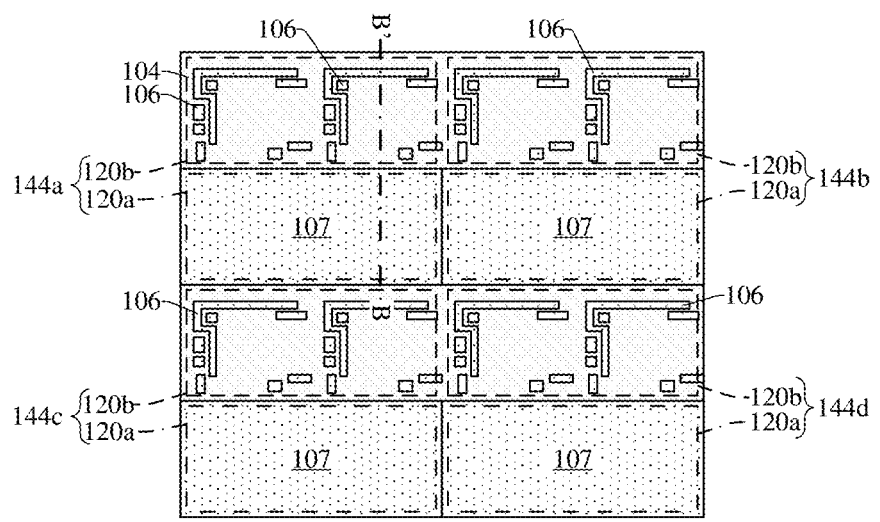

FIGS. 4A-4B illustrate top views of some alternative embodiments of the image sensor device 100 of FIGS. 1A-1C. FIG. 4A illustrates a top view of some embodiments of the image sensor device 100 taken from the line A-A' of the cross-sectional view of FIG. 1A. FIG. 4B illustrates another top view of various embodiments of the image sensor device 100 taken from the line B-B' of the cross-sectional view of FIG. 1A.

In some embodiments, each pixel sensor 144a-d comprises the first image sensor element 120a and the second image sensor element 120b. In some embodiments, an area of the first image sensor element 120a and/or the first light filter 136a is equal to an area of the second image sensor element 120b and/or the second light filter 136b, respectively. Further, the first image sensor element 120a of the first pixel sensor 144a is directly laterally adjacent to the first image sensor element 120a of the second pixel sensor 144b, thereby decreasing cross-talk between the first and second image sensor elements 120a-b of the pixel sensors 144a-d. This, in part, increases the SNR of the second image sensor element 120b of each pixel sensor 144a-d and reduces cross-talk across the plurality of pixel sensors 144a-d, thereby increasing a performance of the image sensor device 100. In yet further embodiments, each first image sensor element 120a comprises at least two IR image sensor elements that are directly laterally adjacent to one another and/or may be separated from one another by the isolation structure (124 of FIG. 1A). In such embodiments, each second image sensor element 120b comprises at least two visible light image sensor elements that are directly laterally adjacent to one another and/or may be separated from one another by the isolation structure (124 of FIG. 1A).

Figure 5A:
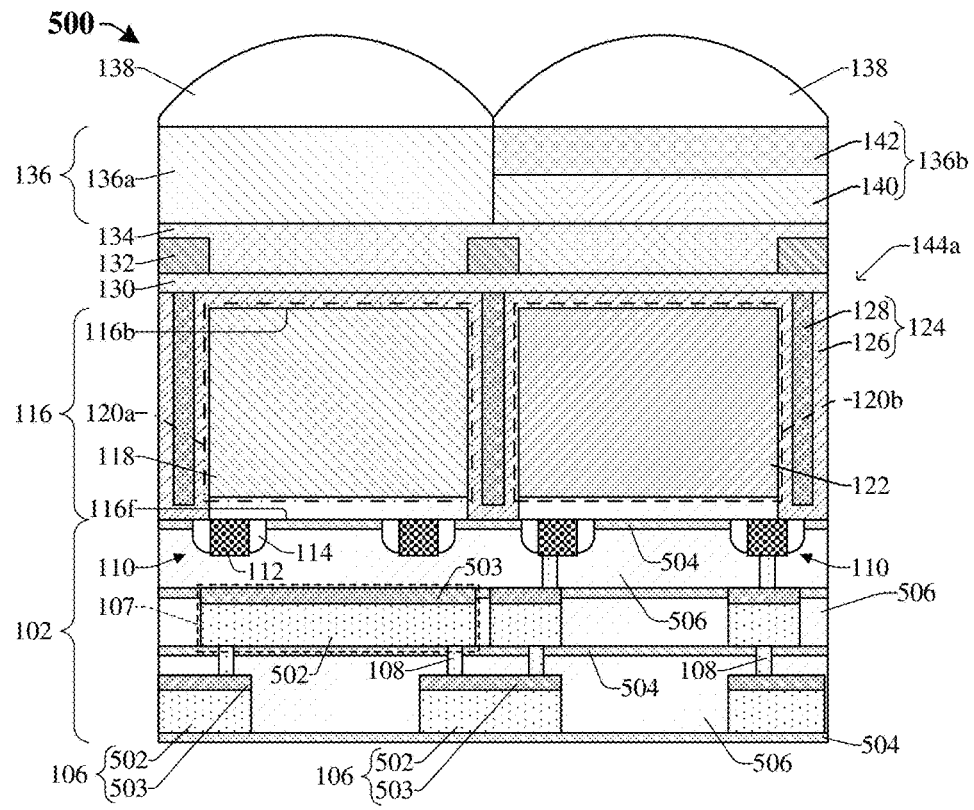
FIGS. 5A-5C illustrate cross-sectional views of some various embodiments of an image sensor device including a first image sensor element, a second image sensor element, and an absorption structure that is configured to decrease cross-talk between the first and second image sensor elements.

FIG. 5A illustrates a cross-sectional view of some embodiments of an image sensor device 500 according to some alternative embodiments of the image sensor device 100 of FIG. 1A.

The image sensor device 500 includes an interconnect structure 102 disposed along a front-side surface 116f of a substrate 116. In some embodiments, the substrate 116 may, for example, be or comprise a bulk substrate (e.g., a bulk silicon substrate), a silicon-on-insulator (SOI) substrate, crystalline silicon, P-doped silicon, or another suitable semiconductor material. The interconnect structure 102 includes a plurality of conductive wires 106, a plurality of conductive vias 108, an interconnect dielectric structure, and an absorption structure 107. In some embodiments, the interconnect dielectric structure comprises a plurality of inter-level dielectric (ILD) layers 506 and a plurality of etch stop layers 504. The plurality of conductive wires 106 and the plurality of conductive vias 108 are disposed within the interconnect dielectric structure and are configured to electrically couple semiconductor devices disposed within the image sensor device 500 to one another and/or to another integrated circuit (IC) (not shown). In some embodiments, the absorption structure 107 and the plurality of conductive wires 106 may each comprise a conductive body 502 and a conductive liner 503. The conductive liner 503 may be disposed along a top surface of each conductive body 502. In yet further embodiments, the conductive liner 503 may extend along the bottom surface and opposing sidewalls of the conductive body 502 (not shown).

In some embodiments, the conductive liner 503 may comprise a conductive material such as, for example, titanium, tantalum, titanium nitride, tantalum nitride, tungsten, another material, or any combination of the foregoing. In further embodiments, the conductive body 502 may, for example, be or comprise aluminum, copper, ruthenium, another material, or any combination of the foregoing. In further embodiments, the plurality of ILD layers 506 may, for example, be or comprise a low-k dielectric material, an extreme low-k dielectric material, silicon dioxide, another dielectric material, or any combination of the foregoing. In yet further embodiments, the plurality of etch stop layers 504 may, for example, be or comprise silicon nitride, silicon carbide, silicon oxynitride, silicon oxycarbide, another dielectric material, or any combination of the foregoing.

Further, the plurality of pixel devices 110 are disposed along the front-side surface 116f of the substrate 116 and may comprise a gate structure 112 and a sidewall spacer structure 114. In some embodiments, the plurality of pixel devices 110 may, for example, be or comprise transfer transistor(s), source-follower transistor(s), row select transistor(s), reset transistor(s), another suitable pixel device(s), or any combination of the foregoing. The plurality of pixel devices 110 may be electrically coupled to the conductive wires and vias 106, 108. A first image sensor element 120a is disposed within the substrate 116, and a second image sensor element 120b is disposed within the substrate 116 and laterally adjacent to the first image sensor element 120a. In some embodiments, the first image sensor element 120a is configured to generate electrical signals from electromagnetic radiation within a first range of wavelengths, while the second image sensor element 120b is configured to generate electrical signals from electromagnetic radiation within a second range of wavelengths that is different than the first range of wavelengths. In some embodiments, the first range of wavelengths may, for example, be or comprise infrared (IR) radiation (e.g., electromagnetic radiation with wavelengths in a range of between approximately 700 nanometers (nm) to approximately 2.5 millimeter (mm)), near IR (NIR) radiation (e.g., electromagnetic radiation with wavelengths in a range of between approximately 700 nm to approximately 1.1 mm), or the like. It will be appreciated that the first range of wavelengths comprising other wavelength values is also within the scope of the disclosure. In further embodiments, the second range of wavelengths includes visible light (e.g., electromagnetic radiation with wavelengths in a range of between approximately 400 nm and approximately 700 nm), or the like. It will be appreciated that the second range of wavelengths comprising other wavelength values is also within the scope of the disclosure. The first image sensor element 120a includes a first photodetector region 118 and the second image sensor element 120b includes a second photodetector region 122. In some embodiments, the first photodetector region 118 and the second photodetector region 122 respectively comprise doped regions of a semiconductor material (e.g., silicon) that the substrate 116 is comprised of. In yet further embodiments, the first photodetector region 118 comprises a layer of another semiconductor material (e.g., germanium) and the second photodetector region 122 comprises the semiconductor material (e.g., silicon), where the another semiconductor material is configured to increase absorption of electromagnetic radiation within the first range of wavelengths.

Furthermore, the isolation structure 124 extends from the back-side surface 116b of the substrate 116 to the front-side surface 116f of the substrate 116. In some embodiments, the isolation structure 124 continuously laterally surrounds the first image sensor element 120a and the second image sensor element 120b, respectively. Thus, the isolation structure 124 is configured to electrically and/or optically isolate the first and second image sensor elements 120a-b from one another and/or from other devices disposed on/within the substrate 116. The isolation structure 124 may include a passivation layer 126 and a trench layer 128. In some embodiments, the passivation layer 126 may, for example, be or comprise silicon dioxide, silicon oxynitride, silicon oxycarbide, another dielectric material, or any combination of the foregoing. Further, the passivation layer 126 may continuously extend along the back-side surface 116b of the substrate 116. The passivation layer 126 is disposed between the substrate 116 and the trench layer 128. In some embodiments, the trench layer 128 may, for example, be or comprise aluminum, tungsten, copper, another material, or any combination of the foregoing. In further embodiments, isolation structure 124 may be configured to direct electromagnetic radiation towards the first image sensor element 120a and/or the second image sensor element 120b. In such embodiments, the electromagnetic radiation may reflect off of sidewalls of the trench layer 128 to the first image sensor element 120a or the second image sensor element 120b. Further, this mitigates electromagnetic radiation within the first range of wavelengths, disposed directly on the first image sensor element 120a, from traveling to the second image sensor element 120b. Thus, the isolation structure 124 may decrease cross-talk between adjacent image sensor elements, thereby increasing a performance of the image sensor device 500.

An upper passivation layer 130 overlies the isolation structure 124. In some embodiments, the upper passivation layer 130 may be configured as an anti-reflection coating (ARC) layer that prevents reflection of electromagnetic radiation away from the back-side surface 116b of the substrate 116. The grid structure 132 overlies the upper passivation layer 130. The grid structure 132 may, for example, comprise a metal grid structure and/or a dielectric grid structure. The grid structure 132 is configured to direct the electromagnetic radiation to the first image sensor element 120a and/or the second image sensor element 120b. In some embodiments, when the grid structure 132 comprises the metal grid structure (e.g., the grid structure 132 comprises aluminum, copper, tungsten, another material, or any combination of the foregoing), electromagnetic radiation may reflect off of the sidewalls of the metal grid structure to the underlying first or second image sensor element 120a-b instead of traveling to adjacent image sensor elements (not shown). This, in part, further decreases cross-talk between adjacent image sensor elements, thereby further increasing the performance of the image sensor device 500. The upper dielectric structure 134 overlies the grid structure 132 and the upper passivation layer 130. In some embodiments, the upper dielectric structure 134 may, for example, comprise an oxide such as silicon dioxide, another dielectric material, or any combination of the foregoing.

In addition, the light filter array 136 overlies the upper dielectric structure 134 and comprises a plurality of light filters 136a-b. In some embodiments, the plurality of light filters 136a-b include a first light filter 136a and a second light filter 136b. The first light filter 136a overlies the first image sensor element 120a and, in some embodiments, is configured to pass wavelengths within the first range of wavelengths while blocking other wavelengths that are different from the first range of wavelengths (e.g., block wavelengths within the second range of wavelengths). In yet further embodiments, the first light filter 136a is configured as an all pass filter that does not block electromagnetic radiation within a range of wavelengths. Furthermore, the second light filter 136b overlies the second image sensor element 120b and, in some embodiments, is configured to pass electromagnetic radiation having wavelengths within the second range of wavelengths while blocking other wavelengths that are different from the second range of wavelengths (e.g., block wavelengths within the first range of wavelengths). In further embodiments, the second light filter 136b comprises a color filter 142 and a band pass filter 140. In some embodiments, the color filter 142 may, for example, be configured as a red color filter, a blue color filter, a green color filter, etc. In further embodiments, the band pass filter 140 is configured to pass electromagnetic radiation within the second range of wavelengths while blocking other wavelengths that are different from the second range of wavelengths (e.g., block wavelengths within the first range of wavelengths). The plurality of micro-lenses 138 overlie the light filter array 136 and are configured to direct electromagnetic radiation towards the first and/or second image sensor elements 120a-b.

The absorption structure 107 underlies the first image sensor element 120a. In some embodiments, the absorption structure 107 directly underlies the first image sensor element 120a. In further embodiments, when viewed from above, an area of the absorption structure 107 is greater than an area of the first image sensor element 120a (e.g., see FIGS. 1B, 2B, 3B, and/or 4B). During operation of the image sensor device 500, electromagnetic radiation may pass from the back-side surface 116b of the substrate 116, through the first image sensor element 120a, to the absorption structure 107. By virtue of the absorption structure 107 including the conductive liner 503 that comprises the conductive material (e.g., titanium nitride, tantalum nitride, tungsten, etc.), the absorption structure 107 is configured to interact with electromagnetic radiation within the first range of wavelengths (e.g., absorb the electromagnetic radiation within the first range of wavelengths). This impedes the electromagnetic radiation within the first range of wavelengths from reflecting towards the second image sensor element 120b, thereby decreasing cross-talk between the first and second image sensor elements and increasing the SNR of the second image sensor element 120b. Thus, a performance of the image sensor device 500 is increased.

Figure 5B:
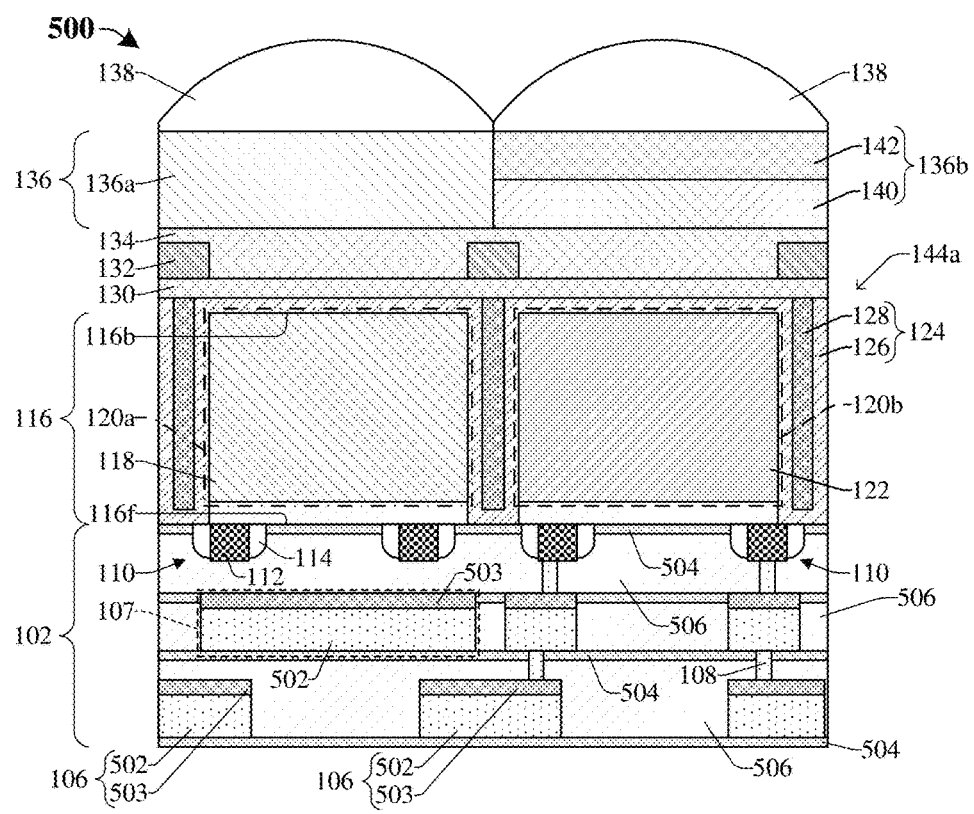

FIG. 5B illustrates a cross-sectional view of some alternative embodiments of the image sensor device 500 of FIG. 5A, where the absorption structure 107 is electrically isolated from the plurality of conductive wires 106, the plurality of conductive vias 108, and/or the plurality of pixel devices 110. In some embodiments, an etch stop layer 504 directly contacts a bottom surface of the absorption structure 107 across an entirety of the bottom surface of the absorption structure 107. In further embodiments, an ILD layer 506 directly contacts a top surface of the absorption structure 107 across an entirety of the top surface of the absorption structure 107. The bottom surface and top surface of the absorption structure 107 are defined between a first outer sidewall and a second outer sidewall of the absorption structure 107, where the first outer sidewall is opposite the second outer sidewall. In yet further embodiments, the ILD layer 506 and the etch stop layer 504 respectively continuously laterally extend along an unbroken path from the first outer sidewall to the second outer sidewall of the absorption structure 107. In such embodiments, the plurality of conductive vias 108 are respectively laterally offset from the top and bottom surfaces of the absorption structure 107, such that the absorption structure 107 is completely separated from the plurality of conductive vias 108 and the plurality of conductive wires 106. It is appreciated that although the cross-sectional view of FIG. 5B illustrates a single absorption structure 107, the absorption structures 107 of FIGS. 1B, 2B, 3B, and/or 4B may respectively be configured as the absorption structure 107 is illustrated and/or described in FIG. 5B.

Figure 5C:
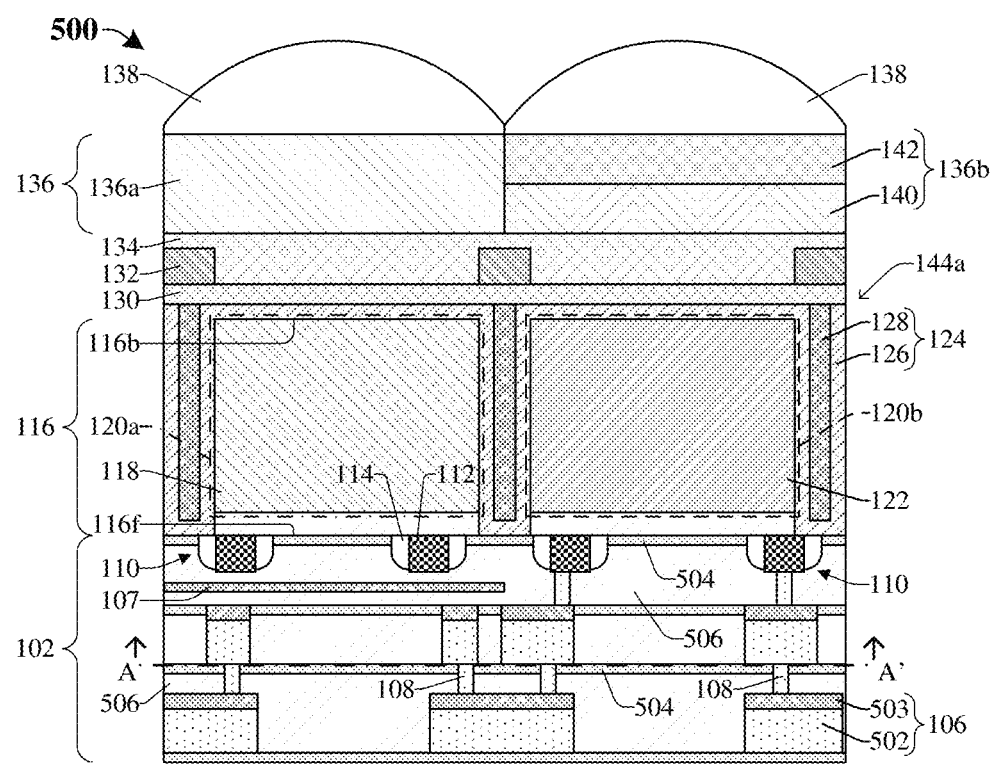

FIG. 5C illustrates a cross-sectional view of some alternative embodiments of the image sensor device 500 of FIG. 5B, where the absorption structure 107 is disposed vertically between the front-side surface 116f of the substrate 116 and the plurality of conductive wires 106. In some embodiments, the absorption structure 107 comprises the conductive material (e.g., titanium nitride, tantalum nitride, tungsten, the like, or any combination of the foregoing) and is disposed in a first ILD layer 506. In yet further embodiments, the first ILD layer 506 directly contacts an entirety of the bottom surface and the top surface of the absorption structure 107, respectively. It is appreciated that although the cross-sectional view of FIG. 5C illustrates a single absorption structure 107, the absorption structures 107 of FIGS. 1B, 2B, 3B, and/or 4B may respectively be configured as the absorption structure 107 is illustrated and/or described in FIG. 5C.

FIGS. 6A-12 illustrate various views 600a-1200 of some embodiments of a method of forming an image sensor device including a first image sensor element, a second image sensor element, and an absorption structure that is configured to decrease cross-talk between the first and second image sensor elements according to the present disclosure. Although the various views 600a-1200 shown in FIGS. 6A-12 are described with reference to a method, it will be appreciated that the structures shown in FIGS. 6A-12 are not limited to the method but rather may stand alone separate of the method. Further, although FIGS. 6A-12 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6A:
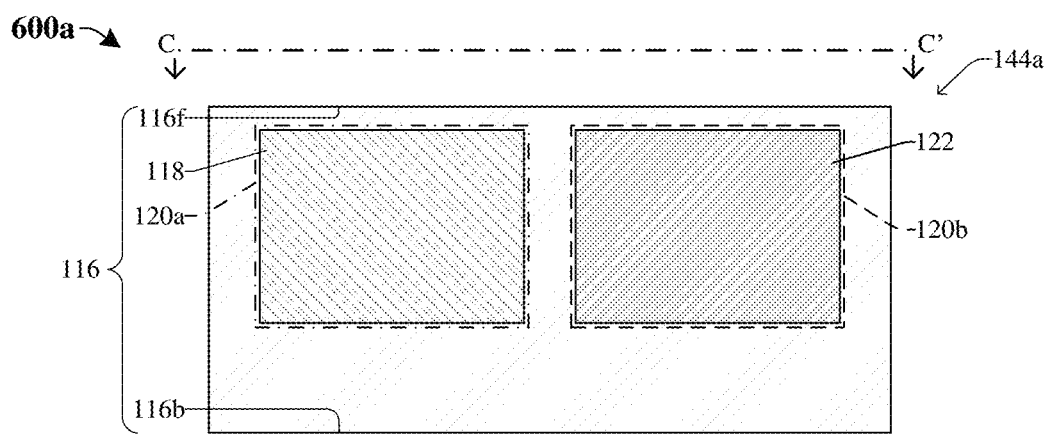
FIGS. 6A-12 illustrate various views of some embodiments of a method of forming an image sensor device including a first image sensor element, a second image sensor element, and an absorption structure that is configured to decrease cross-talk between the first and second image sensor elements.
Figure 6B:
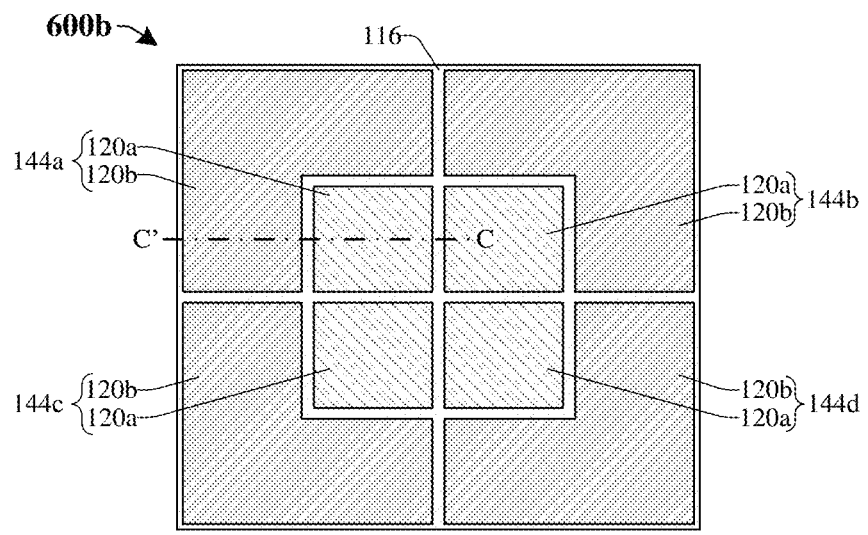

As illustrated in the various views of FIGS. 6A and 6B, a substrate 116 is provided and a plurality of pixel sensors 144a-d is formed within the substrate 116. FIG. 6A illustrates a cross-sectional 600a of some embodiments of forming the plurality of pixel sensors 144a-d. In addition, FIG. 6B illustrates a top view 600b of some embodiments of the cross-sectional view 600a of FIG. 6A taken along the line C-C'.

Each pixel sensor 144a-d comprises a plurality of image sensor elements 120a-b. The plurality of image sensor elements 120a-b includes a first image sensor element 120a laterally adjacent to a second image sensor element 120b. In some embodiments, the substrate 116 may, for example, be a bulk substrate (e.g., a bulk silicon substrate, a silicon-on-insulator (SOI) substrate, or some other suitable substrate and/or comprises a first doping type (e.g. p-type doping). In some embodiments, the first image sensor element 120a is formed with a first photodetector region 118 and the second image sensor element 120b is formed with a second photodetector region 122. In some embodiments, the first photodetector region 118 may, for example, comprise photodetector regions and/or layers such as charge storage region(s), floating node(s), surface pinning region(s), contact region (s), guard ring(s), etc. (not shown) configured to convert electromagnetic radiation (e.g., photons) from the first range of wavelengths into electrical signals and/or facilitate readout of the electrical signals. In addition, the second image sensor element 120b includes a second photodetector region 122 that may, for example, be or comprise the semiconductor material (e.g., silicon) comprising a second doping type (e.g., n-type doping) opposite the first doping type. In yet further embodiments, the first doping type may be p-type and the second doping type may be n-type, or vice versa. In yet further embodiments, the first and/or second image sensor elements 120a-b may be formed by one or more selective ion implantation process(es).

In some embodiments, the first photodetector region 118 may, for example, be or comprise a second semiconductor material (e.g., germanium) that is different from the semiconductor material (e.g., silicon). In such embodiments, a process for forming the first image sensor element 120a may include: selectively etching the substrate 116 to form an opening within the substrate 116; depositing the second semiconductor material (e.g., germanium) in the opening (e.g., by molecular-beam epitaxy (MBE), vapor phase epitaxy (VPE), liquid-phase epitaxy (LPE), some other suitable epitaxial process, chemical vapor deposition (CVD), physical vapor deposition (PVD), or some other suitable deposition or growth process); performing a planarization process (e.g., chemical mechanical polishing (CMP)) into the second semiconductor material; and performing one or more selective ion implantation process(es) to form the photodetector regions within the first photodetector region 118. In some embodiments, the first image sensor element 120*a* is configured to generate electrical signals from electromagnetic radiation within a first range of wavelengths (e.g., IR radiation), while the second image sensor element 120*b* is configured to generate electrical signals from electromagnetic radiation within a second range of wavelengths (e.g., visible light) that is different than the first range of wavelengths.

In some embodiments, the second image sensor element 120*b* is formed such that it extends from a first sidewall of the first image sensor element 120*a* to a second sidewall of the first image sensor element 120*a*. In further embodiments, each pixel sensor 144*a*-*d* comprises the first image sensor element 120*a* and the second image sensor element 120*b*. By virtue of the first image sensor element 120*a* of a first pixel sensor 144*a* being disposed laterally adjacent to the first image sensor element 120*a* of a second pixel sensor 144*b*, cross-talk between the first and second image sensor elements 120*a*-*b* may be reduced. This, in part, increases a performance of an image sensor device.

Figure 7:
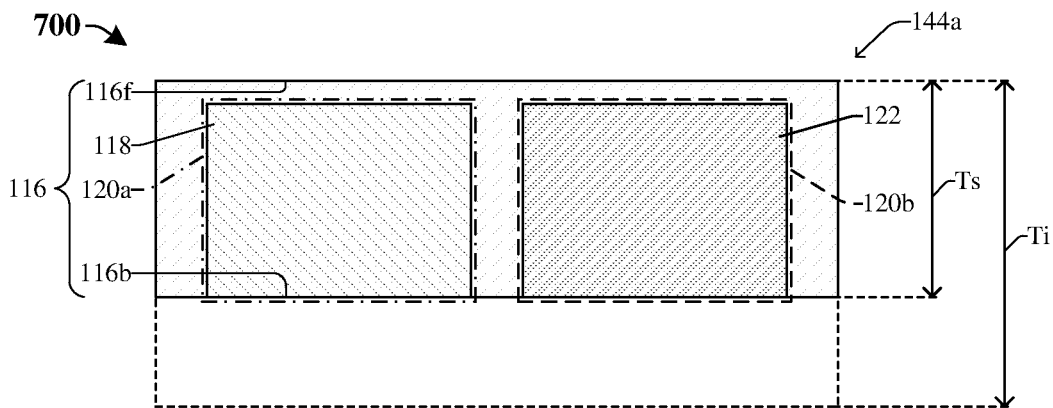

As illustrated in cross-sectional view 700 of FIG. 7, a thinning process is performed on the back-side surface 116*b* of the substrate 116. In some embodiments, a thickness of the substrate 116 is reduced from an initial thickness Ti to a thickness Ts. In further embodiments, the thinning process includes performing a CMP process, a mechanical grinding process, another thinning process, or any combination of the foregoing.

Figure 8A:
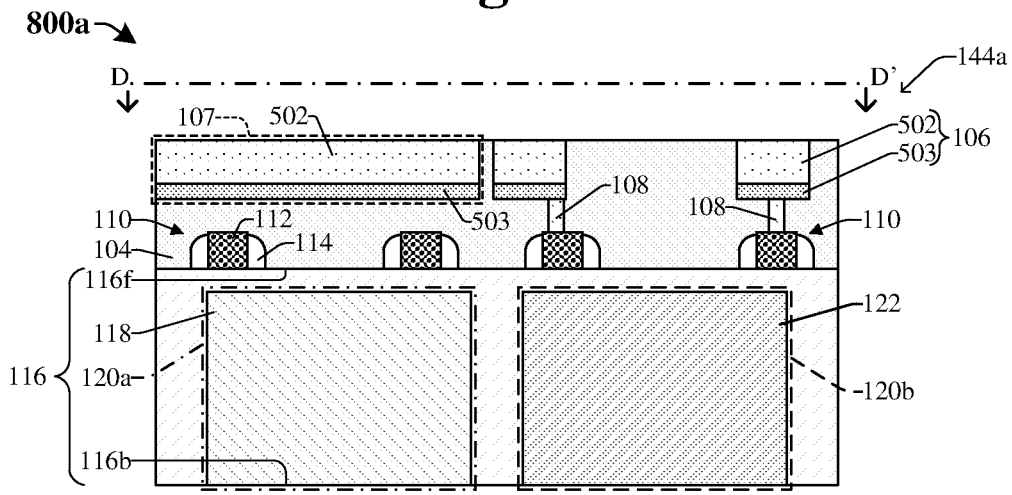
Figure 8B:
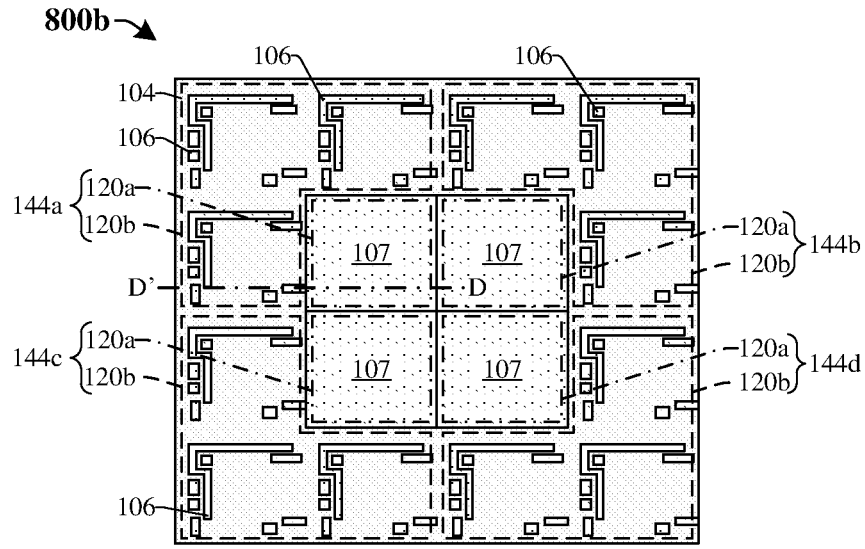

As illustrated in the various views of FIGS. 8A and 8B, a plurality of pixel devices 110 are formed over the front-side surface 116*f* of the substrate 116. FIG. 8A illustrates a cross-sectional 800*a* of some embodiments of forming the plurality of pixel devices 110. In addition, FIG. 8B illustrates a top view 800*b* of some embodiments of the cross-sectional view 800*a* of FIG. 8A taken along the line D-D'.

In some embodiments, each pixel device 110 comprises a gate structure 112 and a sidewall spacer structure 114 that laterally encloses the gate structure 112. In further embodiments, the gate structure 112 includes a gate electrode overlying the substrate 116 and a gate dielectric layer disposed between the substrate 116 and the gate electrode. Subsequently, as illustrated in FIGS. 8A and 8B, an interconnect dielectric structure 104 is formed over the substrate 116, and a plurality of conductive wires 106, a plurality of conductive vias 108, and a plurality of absorption structures 107 are formed within the interconnect dielectric structure 104. In some embodiments, the interconnect dielectric structure 104 may be formed by, for example, CVD, PVD, ALD, another suitable growth or deposition process, or any combination of the foregoing. Further, the interconnect dielectric structure 104 may comprise a plurality of inter-level dielectric (ILD) layers and/or a plurality of etch stop layers (e.g., see FIG. 5A).

In further embodiments, the plurality of conductive wires 106 and the plurality of absorption structures 107 may each comprise a conductive body 502 and a conductive liner 503. In yet further embodiments, the absorption structures 107 directly overlie a corresponding first image sensor element 120*a*. In yet further embodiments, the plurality of conductive wires 106, the plurality of conductive vias 108, and/or the plurality of absorption structures 107 may be formed by a single damascene process, a dual damascene process, or another suitable formation process. In some embodiments, the conductive liner 503 may comprise a conductive material such as, for example, titanium, tantalum, titanium nitride, tantalum nitride, tungsten, another material, or any combination of the foregoing. In further embodiments, the conductive body 502 may, for example, be or comprise aluminum, copper, ruthenium, another material, or any combination of the foregoing. In yet further embodiments, the plurality of absorption structures 107 are formed concurrently with the plurality of conductive wires 106.

Further, as illustrated in FIG. 8B, the absorption structures 107 are formed such that an area of each absorption structure 107 is greater than an area of a corresponding first image sensor element 120*a*. During operation of the first and second image sensor elements 120*a*-*b*, electromagnetic radiation may be disposed on the back-side surface 116*b* of the substrate 116, and travel through the substrate 116 and the first image sensor element 120*a* to the absorption structure 107. By virtue of the absorption structure 107 having the conductive liner 503 that comprises the conductive material (e.g., titanium nitride, tantalum nitride, tungsten, etc.) and having the relatively large area (e.g., greater than the area of the first image sensor element 120*a*), the absorption structure 107 is configured to interact with the electromagnetic radiation within the first range of wavelengths (e.g., absorb the electromagnetic radiation within the first range of wavelengths). This impedes the electromagnetic radiation within the first range of wavelengths from reflecting towards the second image sensor element 120*b*, thereby decreasing cross-talk between the first and second image sensor elements 120*a*-*b* and increasing the SNR of the second image sensor element 120*b*. In some embodiments, FIGS. 2B, 3B, and/or 4B may illustrate top views of some alternative embodiments of the cross-sectional view 800*a* of FIG. 8A taken along the line D-D' of FIG. 8A.

Figure 9:
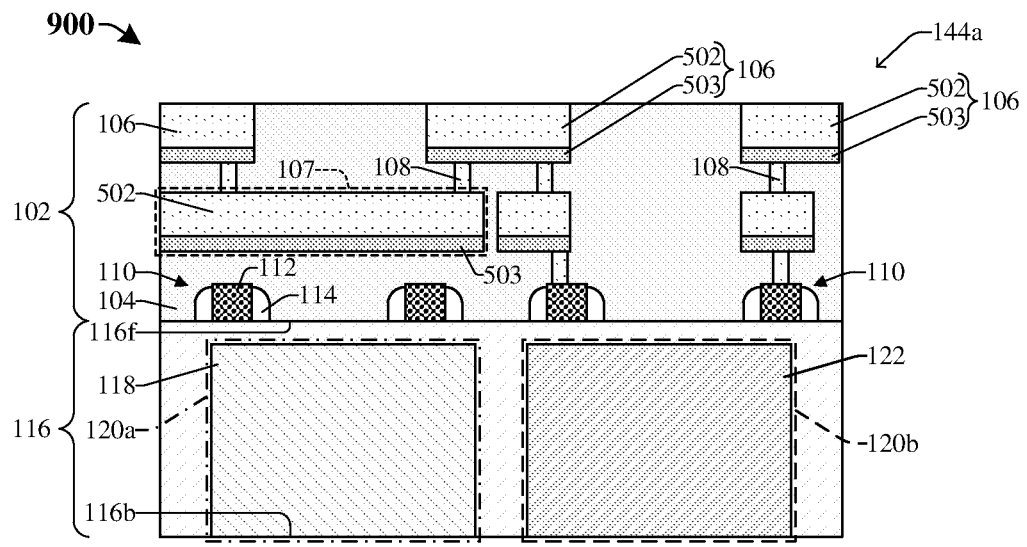

As illustrated in the cross-sectional view 900 of FIG. 9, one or more additional layers of the conductive wires 106 and the conductive vias 108 are formed over the substrate 116, thereby forming the interconnect structure 102 over the front-side surface 116*f* of the substrate 116. In some embodiments, the one or more additional layers of conductive wires and vias 106, 108 may be formed by a single damascene process, a dual damascene process, or another suitable formation process.

Figure 10:
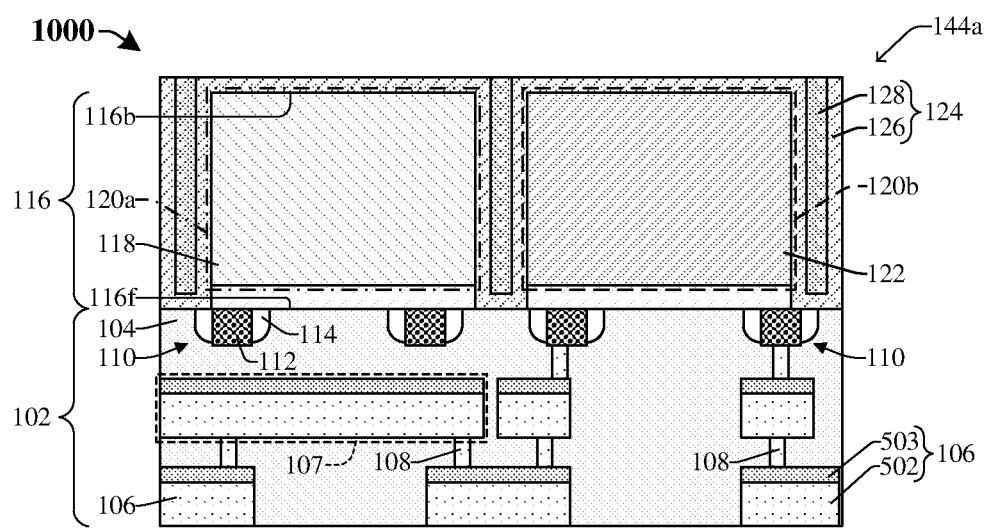

As illustrated in the cross-sectional view 1000 of FIG. 10, an isolation structure 124 is formed within the substrate 116. In some embodiments, the isolation structure 124 comprises a passivation layer 126 and a trench layer 128, where the passivation layer 126 is disposed between the substrate 116 and the trench layer 128. In some embodiments, a method for forming the isolation structure 124 includes: selectively etching the substrate 116 to form an isolation structure opening within the substrate 116; depositing (e.g., by CVD, PVD, ALD, etc.) the passivation layer 126 over the substrate 116, thereby lining the isolation structure opening; depositing (e.g., by CVD, PVD, ALD, etc.) the trench layer 128 over the passivation layer 126; and performing a planarization process into the passivation layer 126 and/or the trench layer 128, thereby forming the isolation structure 124.

Figure 11:
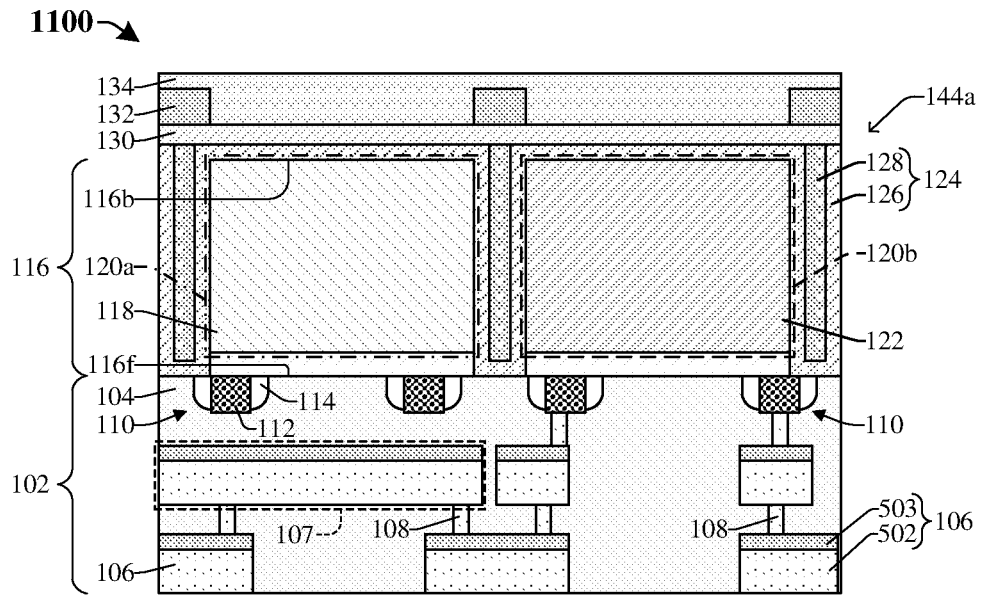

As illustrated in the cross-sectional view 1100 of FIG. 11, an upper passivation layer 130 is formed over the back-side surface 116*b* of the substrate 116. In some embodiments, the upper passivation layer 130 is formed by, for example, CVD, PVD, ALD, or another suitable deposition or growth process. Further, a grid structure 132 is formed over the upper passivation layer 130 and an upper dielectric structure 134 is formed over the upper passivation layer 130. In further embodiments, the grid structure 132 and/or the upper dielectric structure 134 may be formed by, for example, CVD, PVD, ALD, or another suitable deposition or growth process.

Figure 12:
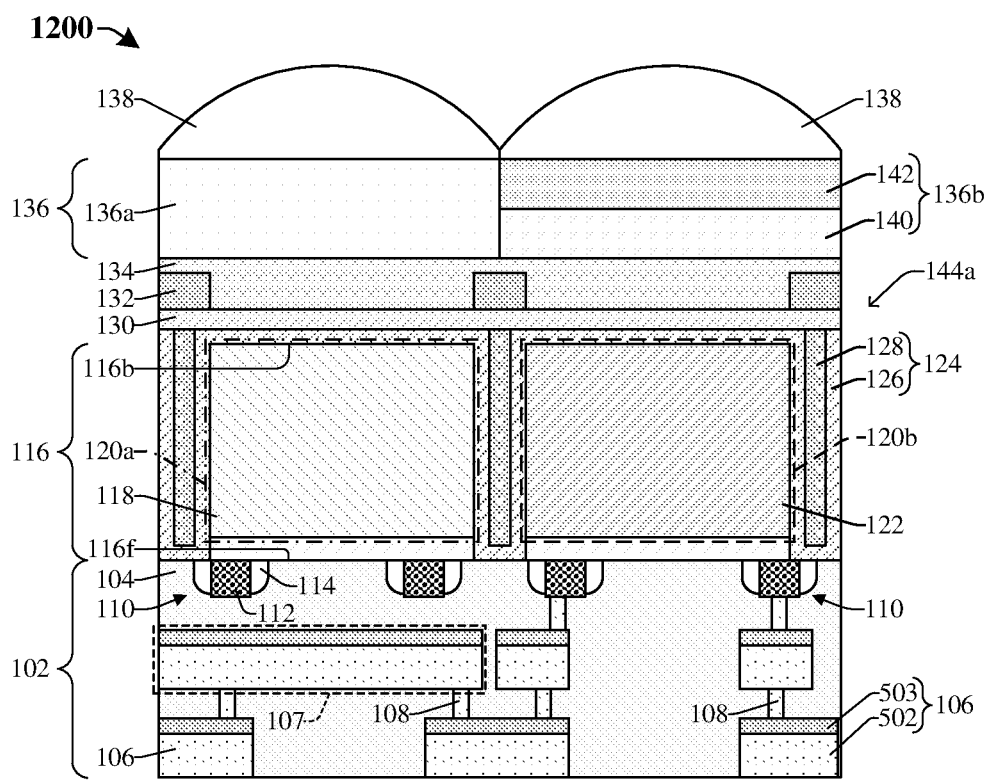

As illustrated in the cross-sectional view 1200 of FIG. 12, a light filter array 136 is formed over the upper dielectric structure 134 and a plurality of micro-lenses 138 are formed over the light filter array 136. In some embodiments, the light filter array 136 comprises a first light filter 136a that overlies the first image sensor element 120a and a second light filter 136b that overlies the second image sensor element 120b. In further embodiments, the second light filter 136b comprises a color filter 142 and a band pass filter 140. In some embodiments, the first and second light filters 136a-b may, for example, respectively be formed by CVD, PVD, ALD, or another suitable growth or deposition process. Further, the plurality of micro-lenses 138 may be formed by, for example, CVD, PVD, ALD, or another suitable growth or deposition process.

FIG. 13 illustrates a method 1300 of some embodiments of forming an image sensor device including a first image sensor element, a second image sensor element, and an absorption structure that is configured to decrease cross-talk between the first and second image sensor elements according to the present disclosure. Although the method 1300 is illustrated and/or described as a series of acts or events, it will be appreciated that the method is not limited to the illustrated ordering or acts. Thus, in some embodiments, the acts may be carried out in different orders than illustrated, and/or may be carried our concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1302, a plurality of pixel sensors are formed within a substrate, where each pixel sensor comprises a first image sensor element laterally adjacent to a second image sensor element. The first image sensor element is configured to generate electrical signals from electromagnetic radiation within a first range of wavelengths, and the second image sensor element is configured to generate electrical signals from electromagnetic radiation within a second range of wavelengths that is different from the first range of wavelengths. FIGS. 6A and 6B illustrate various views 600a and 600b corresponding to some embodiments of act 1302.

At act 1304, an interconnect structure is formed over the front-side surface of the substrate, where the interconnect structure comprises a plurality of conductive wires, a plurality of conductive vias, and a plurality of absorption structures. Each absorption structure comprises a conductive material (e.g., titanium nitride, tantalum nitride, tungsten, etc.) and overlies a corresponding first image sensor element. FIGS. 8A, 8B, and 9 illustrate various views 800a, 800b, and 900 corresponding to some embodiments of act 1304.

At act 1306, an isolation structure is formed into a back-side surface of the substrate. FIG. 10 illustrates a cross-sectional view 1000 corresponding to some embodiments of act 1306.

At act 1308, a grid structure and an upper dielectric structure are formed over the back-side surface of the substrate. FIG. 11 illustrates a cross-sectional view 1100 corresponding to some embodiments of act 1308.

At act 1310, a light filter array is formed over the upper dielectric structure and a plurality of micro-lenses is formed over the light filter array. FIG. 12 illustrates a cross-sectional view 1200 corresponding to some embodiments of act 1310.

Accordingly in some embodiments, the present disclosure relates to an image sensor device comprising a first image sensor element and a second image sensor element. The first image sensor element is configured to generate electrical signals from electromagnetic radiation within a first range of wavelengths and the second image sensor element is configured to generate electrical signals from a second range of wavelengths that is different from the first range of wavelengths. An interconnect structure is disposed along a front-side surface of the substrate and comprises an absorption structure underlying the first image sensor element.

In some embodiments, the present application provides an image sensor device including: a substrate having a front-side surface opposite a back-side surface; an interconnect structure disposed along the front-side surface of the substrate, wherein the interconnect structure includes a plurality of conductive wires, a plurality of conductive vias, and a first absorption structure; a first image sensor element disposed within the substrate and configured to generate electrical signals from an electromagnetic radiation within a first range of wavelengths; and a second image sensor element disposed within the substrate and configured to generate electrical signals from the electromagnetic radiation within a second range of wavelengths that is different than the first range of wavelengths, wherein the second image sensor element is laterally adjacent to the first image sensor element; wherein the first image sensor element overlies the first absorption structure and is spaced laterally between opposing sidewalls of the first absorption structure.

In some embodiments, the present application provides an integrated chip, including: a substrate comprising a front-side surface opposite a back-side surface; a plurality of pixel devices disposed on the front-side surface of the substrate; an interconnect structure disposed along the front-side surface of the substrate, wherein the interconnect structure includes a plurality of conductive wires and a plurality of conductive vias disposed within an interconnect dielectric structure and electrically coupled to the plurality of pixel devices; a plurality of pixel sensors disposed within the substrate, wherein the plurality of pixel sensors respectively include a first image sensor element and a second image sensor element, wherein the first image sensor element is configured to generate electrical signals from infrared (IR) radiation and the second image sensor element is configured to generate electrical signals from visible light; and a plurality of absorption structures disposed within the interconnect dielectric structure and below the plurality of pixel sensors, wherein the first image sensor elements are respectively laterally spaced between opposing sidewalls of a corresponding absorption structure, and wherein the second image sensor elements are laterally offset from the plurality of absorption structures by a non-zero distance.

In some embodiments, the present application provides a method for forming an image sensor device, including: forming a first image sensor element within a substrate, wherein the first image sensor element is configured to generate electrical signals from electromagnetic radiation within a first range of wavelengths; forming a second image sensor element within the substrate and laterally adjacent to the first image sensor element, wherein the second image sensor element is configured to generate electrical signals from electromagnetic radiation within a second range of wavelengths different from the first range of wavelengths;

forming an interconnect structure over the first and second image sensor elements, wherein the interconnect structure comprises a plurality of conductive wires, a plurality of conductive vias, and an absorption structure, wherein the absorption structure comprises a conductive material configure to interact with the first range of wavelengths; and wherein the absorption structure directly overlies the first image sensor element such that the first image sensor element is spaced laterally between opposing sidewalls of the absorption structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an image sensor device, comprising:
    forming a first image sensor element within a substrate, wherein the first image sensor element is configured to generate electrical signals from electromagnetic radiation within a first range of wavelengths;
    forming a second image sensor element within the substrate and laterally adjacent to the first image sensor element, wherein the second image sensor element is configured to generate electrical signals from electromagnetic radiation within a second range of wavelengths different from the first range of wavelengths;
    forming a third image sensor element within the substrate, wherein the third image sensor element is configured to generate electrical signals from electromagnetic radiation within the first range of wavelengths, and wherein the third image sensor element abuts the first image sensor element;
    forming an isolation structure within the substrate, wherein the first image sensor element is disposed between a first sidewall of the isolation structure and a second sidewall of the isolation structure;
    forming an interconnect structure over the first and second image sensor elements, wherein the interconnect structure comprises a plurality of conductive wires, a plurality of conductive vias, a first absorption structure, and a second absorption structure, wherein the first absorption structure comprises a conductive material configure to interact with the first range of wavelengths; and
        wherein the first absorption structure directly overlies the first image sensor element such that the first image sensor element is spaced laterally between opposing sidewalls of the first absorption structure, wherein the first absorption structure continuously laterally extends from a first point aligned with the first sidewall to a second point aligned with the second sidewall, wherein the second absorption structure directly overlies the third image sensor element and abuts the first absorption structure.

2. The method of claim 1, wherein a sidewall of the first absorption structure directly contacts a sidewall of the second absorption structure.

3. The method of claim 1, wherein the first absorption structure comprises a conductive liner disposed on a conductive body, wherein the conductive liner is disposed between the conductive body and the first image sensor element.

4. The method of claim 1, wherein when viewed in top view an area of the first absorption structure is greater than an area of the first image sensor element.

5. The method of claim 1, further comprising:
    forming a first light filter and a second light filter on a back-side surface of the substrate, wherein the first light filter is laterally aligned with the first image sensor element and the second light filter is laterally aligned with the second image sensor element, wherein when viewed in top view a shape of the first light filter is different from a shape of the second light filter.

6. The method of claim 1, wherein a lateral distance between the first and second sidewalls is less than a lateral width of the first absorption structure.

7. The method of claim 1, wherein outer sidewalls of the first absorption structure are aligned with outer sidewalls of the second absorption structure.

8. A method of forming an image sensor device, comprising:
    forming a first image sensor element, a second image sensor element, and a third image sensor element within a substrate having a front-side surface opposite a back-side surface, wherein the first and third image sensor elements are configured to generate electrical signals from infrared (IR) radiation and the second image sensor element is configured to generate electrical signals from visible light;
    forming a dielectric structure on the front-side surface of the substrate;
    forming a first absorption structure, a second absorption structure, and a plurality of conductive wires within the dielectric structure, wherein a bottom surface of the first absorption structure is vertically aligned with a bottom surface of the plurality of conductive wires, wherein the first image sensor element is spaced between outer sidewalls of the first absorption structure, wherein the plurality of conductive wires are laterally offset from a middle region of the second image sensor element; and
    forming a grid structure on the back-side surface of the substrate, wherein the first image sensor element is spaced between a first sidewall and a second sidewall of the grid structure, wherein a first distance between the first and second sidewalls of the grid structure is less than a second distance between the outer sidewalls of the first absorption structure, wherein the first absorption structure directly underlies the first and second sidewalls of the grid structure, wherein the second absorption structure underlies the third image sensor element and abuts the first absorption structure.

9. The method of claim 8, wherein the first absorption structure is configured to interact with the IR radiation.

10. The method of claim 8, further comprising:
    forming a first pixel device on the front-side surface of the substrate; and
    forming a second pixel device on the front-side surface of the substrate, wherein the first pixel device is adjacent to a first outer sidewall of the outer sidewalls of the first absorption structure and the second pixel device is adjacent to a second outer sidewall of the outer sidewalls of the first absorption structure.

11. The method of claim 8, further comprising:
forming a first light filter and a second light filter over the grid structure, wherein the first light filter is aligned with the first image sensor element and the second light filter is aligned with the second image sensor element, wherein the second light filter contacts a first sidewall and a second sidewall of the first light filter.

12. The method of claim 11, wherein the first sidewall of the first light filter is perpendicular to the second sidewall of the first light filter.

13. The method of claim 11, wherein the second light filter comprises a band pass filter vertically stacked with a color filter.

14. The method of claim 8, wherein a vertical distance between the first absorption structure and the front-side surface is equal to a shortest vertical distance between the plurality of conductive wires and the front-side surface.

15. The method of claim 8, wherein when viewed from above a first area of the first absorption structure is equal to a second area of the second absorption structure.

16. A method of forming an image sensor device, comprising:
forming a plurality of image sensor elements within a substrate having a first surface opposite a second surface, wherein the plurality of image sensor elements comprise a plurality of visible light sensors and a plurality of infrared (IR) sensors, wherein corners of the IR sensors respectively abut a center point of the plurality of image sensor elements;
forming a dielectric structure on the first surface of the substrate; and
forming a plurality of absorption structures within the dielectric structure, wherein the absorption structures are respectively aligned with a corresponding IR sensor in the plurality of IR sensors, wherein outer edges of the absorption structures meet at the center point of the plurality of image sensor elements, wherein adjacent absorption structures in the plurality of absorption structures directly contact one another along corresponding adjacent sidewalls.

17. The method of claim 16, further comprising:
forming a first plurality of light filters on the second surface of the substrate, wherein the first plurality of light filters are laterally aligned with the plurality of IR sensors, wherein when viewed in top view the first plurality of light filters have a same shape as the plurality of absorption structures.

18. The method of claim 17, wherein outer edges of the light filters in the first plurality of light filters meet at the center point.

19. The method of claim 16, wherein the plurality of visible light sensors laterally wrap around the plurality of absorption structures.

20. The method of claim 1, wherein when viewed in top view an area of the first absorption structure is greater than an area of the first image sensor element and the area of the first absorption structure is less than an area of the second image sensor element.

* * * * *